United States Patent
Kim et al.

(10) Patent No.: US 9,775,230 B2
(45) Date of Patent: Sep. 26, 2017

(54) PRINTED CIRCUIT BOARD AND SEMICONDUCTOR PACKAGES INCLUDING THE SAME

(71) Applicant: Samsung Electronics Co., Ltd., Suwon-si, Gyeonggi-do (KR)

(72) Inventors: Young-jae Kim, Hwaseong-si (KR); Hyung-gil Baek, Suwon-si (KR); Baik-woo Lee, Gwangmyeong-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 15/232,794

(22) Filed: Aug. 9, 2016

(65) Prior Publication Data

US 2017/0064824 A1 Mar. 2, 2017

(30) Foreign Application Priority Data

Aug. 28, 2015 (KR) .................. 10-2015-0121825

(51) Int. Cl.
| | |
|---|---|
| *H05K 1/02* | (2006.01) |
| *H05K 1/11* | (2006.01) |
| *H05K 1/18* | (2006.01) |
| *H05K 3/00* | (2006.01) |
| *H05K 3/40* | (2006.01) |
| *H05K 3/22* | (2006.01) |

(52) U.S. Cl.
CPC .......... *H05K 1/0219* (2013.01); *H05K 1/111* (2013.01); *H05K 1/183* (2013.01); *H05K 3/0073* (2013.01); *H05K 3/22* (2013.01); *H05K 3/4007* (2013.01); *H01L 2224/16225* (2013.01); *H01L 2224/48091* (2013.01); *H01L 2224/48227* (2013.01); *H01L 2924/15311* (2013.01); *H01L 2924/181* (2013.01); *H05K 2203/1105* (2013.01)

(58) Field of Classification Search
CPC ..... H05K 1/0219; H05K 1/0296; H05K 1/181
See application file for complete search history.

(56) References Cited

U.S. PATENT DOCUMENTS

| | | | |
|---|---|---|---|
| 5,994,766 A | 11/1999 | Shenoy et al. | |
| 6,072,236 A | 6/2000 | Akram et al. | |
| 7,208,403 B2 | 4/2007 | Fang et al. | |
| 7,999,189 B2 | 8/2011 | Chen et al. | |
| 8,115,104 B2 * | 2/2012 | Liao | H05K 3/062 174/255 |
| 2008/0268579 A1 | 10/2008 | Yu et al. | |
| 2009/0288861 A1 | 11/2009 | Liao | |
| 2013/0009286 A1 | 1/2013 | Kim et al. | |
| 2013/0099006 A1 | 4/2013 | Hong et al. | |
| 2013/0270418 A1 | 10/2013 | Cho et al. | |

(Continued)

*Primary Examiner* — Jeremy C Norris
(74) *Attorney, Agent, or Firm* — Renaissance IP Law Group LLP

(57) ABSTRACT

A printed circuit board is provided. The printed circuit board comprises a base substrate comprising a chip mounting region on an upper surface thereof, a plurality of connection pad structures in the chip mounting region, and an extension pattern on the base substrate, spaced from each of two adjacent connection pad structures from among the plurality of connection pad structures, and extending along the two adjacent connection pad structures. Upper surfaces of the plurality of connection pad structures are positioned at a higher level than an upper surface of the extension pattern.

20 Claims, 26 Drawing Sheets

(56) References Cited

U.S. PATENT DOCUMENTS

2014/0008117 A1    1/2014   Huang
2014/0252598 A1    9/2014   Yu et al.
2015/0061143 A1*   3/2015   Kim ..................... H01L 21/768
                                                           257/773

* cited by examiner

PRINTED CIRCUIT BOARD AND SEMICONDUCTOR PACKAGES INCLUDING THE SAME

CROSS-REFERENCE TO RELATED APPLICATION

This application claims the benefit of Korean Patent Application No. 10-2015-0121825, filed on Aug. 28, 2015, in the Korean Intellectual Property Office, the disclosure of which is incorporated herein in its entirety by reference.

BACKGROUND

The inventive concept relates to printed circuit boards and semiconductor packages including the printed circuit boards, and more particularly, to a printed circuit board for mounting a semiconductor chip including a connection terminal having a fine pitch and a semiconductor package including the printed circuit board.

Electronic devices have become smaller and increasingly multifunctional responding to the rapid development of the electronics industry and user demands. Accordingly, a need for smaller and more multifunctional semiconductor devices used in electronic devices has also increased. When a semiconductor chip including a connection terminal having a fine pitch is used, however, defects might occur during the process of connecting the semiconductor chip and a printed circuit board.

SUMMARY

The inventive concept provides printed circuit boards for mounting a semiconductor chips including a connection terminal having a fine pitch and a semiconductor package including the printed circuit board.

According to an aspect of the inventive concept, there is provided a printed circuit board comprising: a base substrate comprising a chip mounting region on an upper surface thereof, a plurality of connection pad structures in the chip mounting region, and an extension pattern on the base substrate, spaced apart from each of two adjacent connection pad structures, and extending between the two adjacent connection pad structures. Upper surfaces of the plurality of connection pad structures are positioned at a higher level than an upper surface of the extension pattern.

According to another aspect of the inventive concept, there is provided a printed circuit board comprising: a base substrate comprising a chip mounting region on an upper surface thereof, first and second connection pad structures spaced apart from each other in the chip mounting region, and an extension pattern on the base substrate, spaced apart from each of the first and second connection pad structures, and extending between the first and second connection pad structures. The first and second connection pad structures are partially embedded in the base substrate and upper surfaces of the first and second connection pad structures are positioned at a higher level than an upper surface of the base substrate.

According to another aspect of the inventive concept, there is provided a method of manufacturing a printed circuit board. An extension pattern and a lower connection pattern on a conductive film is formed, and a base substrate in which the extension pattern and the lower connection pattern are partially embedded is formed by attaching a semi-curing insulating material onto the conductive film and curing the semi-curing insulating material. A connection pad connected to the lower connection pattern is formed by removing a portion of the conductive film such that the conductive film remains connected to the lower connection pattern.

BRIEF DESCRIPTION OF THE DRAWINGS

Example embodiments of the inventive concept will be more clearly understood from the following detailed description taken in conjunction with the accompanying drawings in which.

DETAILED DESCRIPTION OF THE EMBODIMENTS

Figure 1:
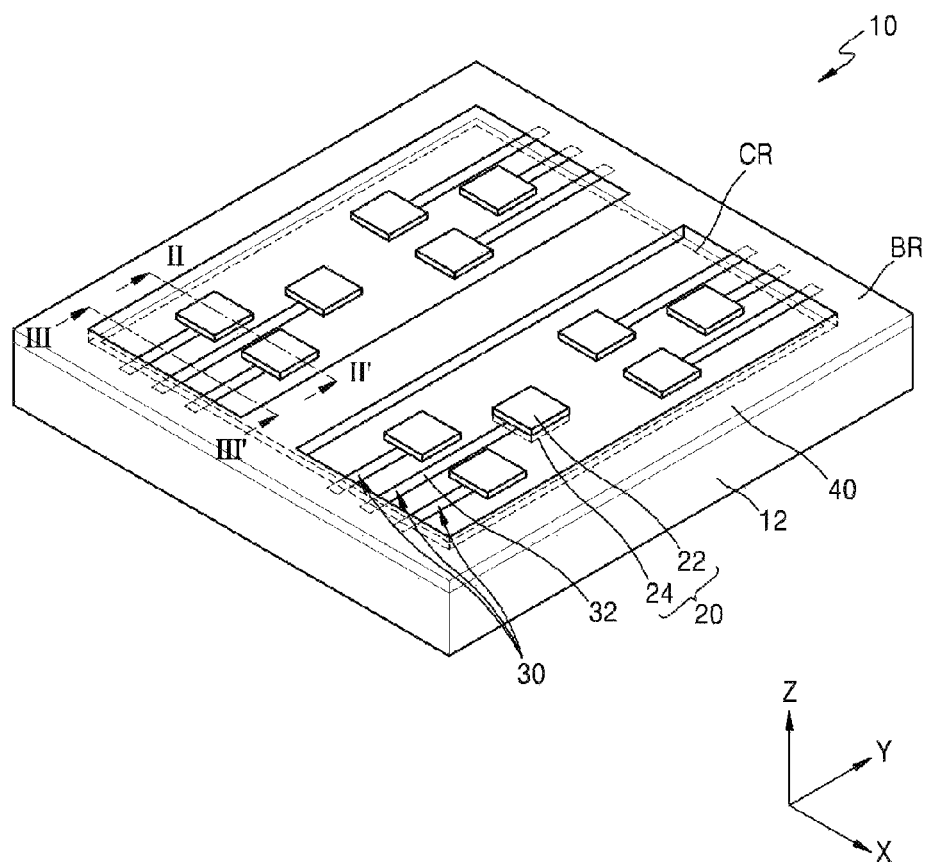
FIG. 1 is a perspective view of a printed circuit board according to example embodiments.

Various example embodiments of the inventive concept will now be described more fully hereinafter with reference to the accompanying drawings to better understand configurations and effects of the inventive concept. It should be noted, however, that the inventive concept is not limited to the following example embodiments, and may be implemented in various forms. Rather, these embodiments are provided so that this disclosure will be thorough and complete, and will fully convey the scope of the inventive concept to those skilled in the art. In the drawings, embodiments of the inventive concept are not limited to the specific examples provided herein and are exaggerated for clarity.

It will be understood that when an element such as a layer, region or substrate is referred to as being "on" another element, it can be directly on the other element or intervening elements may be present. In contrast, the term "directly" means that there are no intervening elements. Other words used to describe the relationship between elements or layers should be interpreted in a like fashion (e.g., "between" versus "directly between," "adjacent" versus "directly adjacent," "on" versus "directly on").

It will also be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

As used herein, the singular terms "a," "an" "and" "the" are intended to include the plural forms as well, unless the context clearly indicates otherwise. It will be further understood that the terms "comprises", "comprising," "includes" and/or "including", when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which example embodiments belong. As used herein, the term "and/or" includes any and all combinations of one or more of the associated listed items. In addition, expressions such as "at least one of," when preceding a list of elements, modify the entire list of elements and do not modify the individual elements of the list.

Figure 2A:
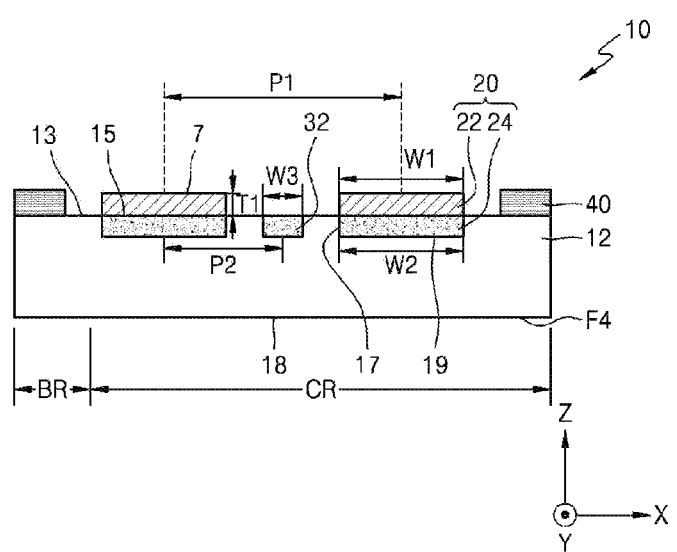
FIG. 2A is a cross-sectional view taken along line II-II' of FIG. 1.
Figure 2B:
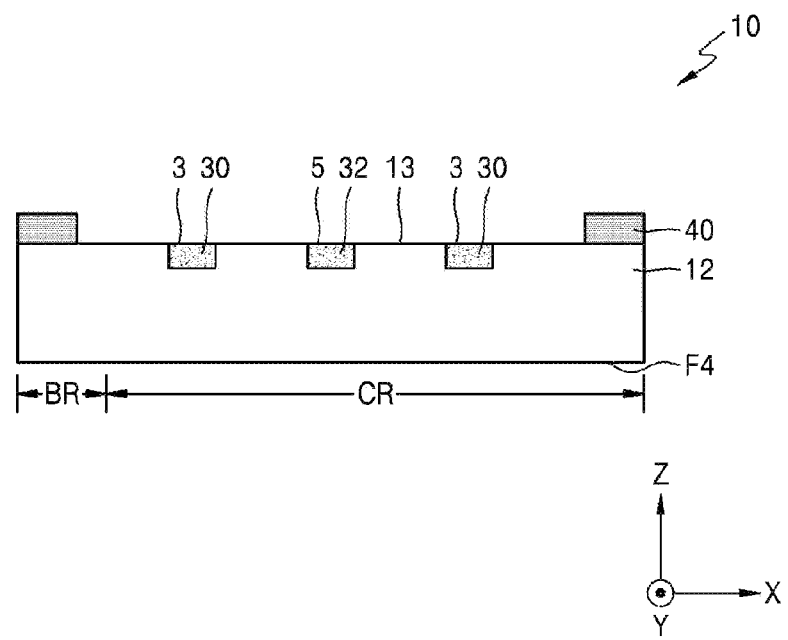
FIG. 2B is a cross-sectional view taken along line III-III' of FIG. 1.

FIGS. 1 and 2A-2B schematically illustrate a printed circuit board 10 according to example embodiments. In more detail, FIG. 1 is a perspective view of the printed circuit board 10 according to example embodiments, FIG. 2A is a cross-sectional view taken along line II-II' of FIG. 1, and FIG. 2B is a cross-sectional view taken along line of FIG. 1.

Referring to FIGS. 1 and 2A-2B, the printed circuit board 10 may include a base substrate 12 provided with a chip mounting region CR and a periphery region BR, a plurality of connection pad structures 20 disposed on the base substrate 12, a conductive pattern structure 30, and a solder resist layer 40.

The base substrate 12 may be formed of an insulating material that may be a rigid material or a flexible material. The base substrate 12 may be formed of a material such as phenol resin, epoxy resin, polyimide or combinations thereof. For example, the base substrate 12 may include at least one of bismaleimide triazine (BT), flame retardant class 4 (FR4), polyimide, polyester, tetra-functional epoxy, polyphenylene ether, epoxy/polyphenylene oxide, thermount, cyanate ester, or liquid crystal polymer.

The base substrate 12 may be the insulating material of a single layer, i.e., a single layer structure. Alternatively, the base substrate 12 may be formed by bonding a plurality of insulating materials, i.e. a multilayer structure.

The plurality of connection pad structures 20 may be formed on an upper surface 13 of the base substrate 12. The plurality of connection pad structures 20 may be disposed in the chip mounting region CR of the base substrate 12 and may be disposed in positions corresponding to chip connection terminals (see 120 of FIG. 11) of a semiconductor chip (see 110 of FIG. 11) that is to be mounted on the printed circuit board 10.

Each of the plurality of connection pad structures 20 may include a connection pad 22 and a lower connection pattern 24. The lower connection pattern 24 may be at least partially embedded in the base substrate 12. An upper surface 15 of the lower connection pattern 24 may be positioned at substantially the same level as the upper surface 13 of the base substrate 12. Therefore, a plurality of connection pads 22 and lower connection patterns 24 may be provided, where each of the plurality of connection pads 22 may be disposed on a corresponding one of the upper surfaces 15 of the plurality of lower connection patterns 24 and thus having a structure protruding from the upper surface 13 of the base substrate 12.

In this regard, at least partial embedding of the plurality of lower connection patterns 24 in the base substrate 12 may mean that at least one of the surfaces 15, 17, 19 of the lower connection patterns 24 may be in contact with the base substrate 12 and at least one of the surfaces 15, 17, 19 may be exposed. For example, the side surfaces 17 and the lower surfaces 19 of the plurality of lower connection patterns 24 may be in contact with the base substrate 12, and the upper surfaces 15 of the plurality of lower connection patterns 24 may not be in contact with the base substrate 12.

In some embodiments, each of the plurality of connection pads 22 may substantially entirely cover the upper surface of a corresponding one of the plurality of lower connection patterns 24. For example, the plurality of connection pads 22 may have a first width W1 in a horizontal direction or in a direction substantially parallel to the upper surface 13 of the base substrate 12, and the plurality of lower connection patterns 24 may have a second width W2 in the horizontal direction. In this regard, the first width W1 of the plurality of connection pads 22 may be greater than or equal to the second width W2 of the plurality of lower connection patterns 24 as shown in FIG. 2A.

On the other end, the first width W1 of the plurality of connection pads 22 may be greater than the second width W2 of the plurality of lower connection patterns 24. In some embodiments, the first width W1 of the plurality of connection pads 22 may be in a range from about 10 to about 100 micrometers but is not limited thereto. The second width W2 of the plurality of lower connection patterns 24 may be in a range from about 10 to about 100 micrometers but is not limited thereto.

As shown in FIG. 2A, one of the plurality of connection pad structures 20 may be spaced apart from an adjacent connection pad structure 20 by a first pitch P1. In this regard, the first pitch P1 may mean a distance between centers of the two adjacent connection pad structures 20. In more detail, the first pitch P1 may be referred to as a distance between centers of the two adjacent connection pads 22 in the horizontal direction. In some embodiments, the first pitch P1 may be in a range from about 20 to about 200 micrometers. For example, the first pitch P1 may be in a range from about 50 to about 120 micrometers but is not limited thereto.

The first pitch P1 may be different according to a pitch of a conductive pillar (see 122 of FIG. 11) disposed on an active surface (see 112 of FIG. 11) of a semiconductor chip (see 110 of FIG. 11) that is to be attached to the plurality of connection pad structures 20, the height and/or width of the conductive pillar 122, the height and/or width of a solder bump (see 124 of FIG. 11) connected to the conductive pillar 122, the size of the semiconductor chip 110, the area and/or the number of the plurality of connection pad structures 20 and so on. For example, if the first pitch P1 is too small, when a position of the solder bump 124 is shifted by a predetermined distance, the solder bump 124 can be connected or in contact with the upper surface of an adjacent connection pad structure 20, an electrical short may occur. If the first pitch P1 is too large, an area of the base substrate 12 necessary for disposing a determined number of the plurality of connection pad structures 20 increases, which may make it difficult to obtain a compact semiconductor package.

An external connection pad (see 52 of FIG. 11) may be disposed on the lower surface 18 of the base substrate 12. An external terminal (see 54 of FIG. 11) may be attached to the external connection pad 52.

In some embodiments, the conductive pattern structure 30 may be formed on the upper surface 13 of the base substrate 12. Although not shown, a lower conductive structure (not shown) may be formed on the lower surface of the base substrate 12 to be connected to the external connection pad 52 or spaced apart from the external connection pad 52.

A through electrode (not shown) that electrically connects the upper surface and the lower surface of the base substrate 12 may be formed inside the base substrate 12. The connection pad 22 may be electrically connected to the external connection pad 52 via the through electrode.

If the base substrate 12 includes a plurality of insulating material layers, an internal conductive pattern structure (not shown) may be formed between the two adjacent insulating material layers. If the base substrate 12 includes the plurality of insulating material layers, the through electrode may pass through one or more insulating material layers and may be electrically connected to the internal conductive pattern structure.

The conductive pattern structure 30 may be disposed on the chip mounting region CR of the base substrate 12. A portion of the conductive pattern structure 30 may extend to or over a portion of the peripheral region BR. The conductive pattern structure 30 may be electrically connected to a corresponding one of the plurality of connection pad structures 20 and may be electrically connected to the lower conductive structure via the through electrode or may be electrically connected to the internal conductive pattern structure. Alternatively, the conductive pattern structure 30 may be electrically connected to the external connection pad 52 disposed on the lower surface of the base substrate 12 via the through electrode. However, a layout of the conductive pattern structure 30 is not limited thereto and may vary according to the number and the layout of the plurality of connection pad structures 20 and an electrical characteristic of the printed circuit board 10 and so on.

In some embodiments, as shown in FIG. 2B, the conductive pattern structure 30 may be at least partially embedded in the base substrate 12. An upper surface 3 of the conductive pattern structure 30 may be positioned at substantially the same level as the upper surface 13 of the base substrate 12.

The conductive pattern structure 30 may be an extension pattern 32 electrically connected to the lower connection pattern 24 as shown in FIG. 1. A portion of the extension pattern 32 may extend between the two adjacent connection pad structures 20. The extension pattern 32 may be spaced apart from the two adjacent connection pad structures 20. The extension pattern 32 may have a third width W3 in a direction substantially perpendicular to a direction in which the extension pattern 32 extends. In some embodiments, the third width W3 may be in a range from about 2 to about 50 micrometers. For example, the third width W3 may be in a range from about 5 to about 20 micrometers. However, the third width W3 is not limited thereto. If the third width W3 is too small, since resistance of the conductive pattern structure 30 is reduced, the package performance may deteriorate. If the third width W3 is too large, the area of the base substrate 12 necessary for disposing a determined number of the extension pattern 32 increases, which may make it difficult to obtain a compact semiconductor package.

As shown in FIG. 2A-2B, the extension pattern 32 may be partially embedded in the base substrate 12, and an upper surface 5 of the extension pattern 32 may be positioned at substantially the same level as the upper surface 13 of the base substrate 12. On the other hand, upper surfaces 7 of the plurality of connection pad structures 20 may be positioned at a higher level than the upper surface 13 of the base substrate 12. Thus, the upper surfaces 7 of the plurality of connection pad structures 20 may be positioned at a higher level than the upper surface 5 of the extension pattern 32, and the distance between the upper surfaces 7 of the plurality of connection pad structures 20 and the upper surface 5 of the extension pattern 32 may be further increased compared to a case where the plurality of connection pad structures 20 and the extension pattern 32 are positioned at the same level.

As shown in FIG. 2B, the plurality of connection pad structures 20 and the extension pattern 32 adjacent to the plurality of connection pad structures 20 may be spaced apart from each other by a second pitch P2. In this regard, the second pitch P2 may mean a distance between a center of one of the plurality of connection pad structures 20 and a center of the extension pattern 32 adjacent to the connection pad structure 20. For example, the second pitch P2 may be a distance between each center of connection pad structures 20 and a center of an adjacent extension pattern 32 in the horizontal direction. In example embodiments, the second pitch P2 may be in a range from about 10 to about 100 micrometers but is not limited thereto. In example embodiments, the second pitch P2 may be in a range of from about 20% to about 50% of the first pitch P1.

In some embodiments, each of the plurality of connection pad structures 20 and the conductive pattern structure 30 may include a metal material including copper such as copper-nickel (Cu—Ni), stainless steel, or beryllium copper or may be formed by partially plating a pattern including copper or the metal material including copper with another material such as nickel (Ni) or gold (Au).

The plurality of connection pads 22 may protrude from the upper surface 13 of the base substrate 12. The plurality of lower connection patterns 24 and the conductive pattern structures 30 may have the upper surfaces 15, 3, respectively, positioned at the same level as that of the base substrate 12. The plurality of connection pads 22 may be copper foil patterns formed by coating and patterning a copper foil on the upper surface of the base substrate 12. The plurality of lower connection patterns 24 and the conductive pattern structures 30 may include a copper metal layer grown by using electroplating on the copper foil. Alternatively, the plurality of connection pads 22 may further include a metal layer (not shown) formed on the copper foil patterns. The metal layer may increase contact strength between the plurality of connection pads 22 and a solder bump of a semiconductor chip that is to be attached to the printed circuit board 10 and reduce the contact resistance therebetween. For example, the metal layer may be formed using hot air solder leveling (HASL), Ni/Au plating and so on.

The solder resist layer 40 may be formed on the upper surface 13 of the base substrate 12. The solder resist layer 40 may be formed by using a solder mask insulating ink of an epoxy component. The solder resist layer 40 may be formed by directly coating and thermally curing a thermosetting ink, for example, using a silk screen printing method or an ink jet method. The solder resist layer 40 may be formed by entirely coating, for example, photo-imageable solder resist by using a screen method or a spray coating method, removing an unnecessary portion through exposure and developing, and thermally curing the remaining photo-imageable solder resist. The solder resist layer 40 may be formed, for example, using a laminating method of bonding a film-type solder resist material onto the base substrate 12.

The solder resist layer 40 may be disposed in at least a part of the peripheral region BR. As shown in FIG. 1, the solder resist layer 40 may surround the chip mounting region CR of the base substrate 12. In some embodiments, the solder resist layer 40 may be disposed in a portion of the chip mounting region CR.

The solder resist layer 40 may cover a portion of the conductive pattern structure 30 in the peripheral region BR or the chip mounting region CR. The solder resist layer 40 may not be disposed in a region between two adjacent connection pad structures 20. The solder resist layer 40 may not be disposed in a region between each of the two adjacent connection pad structures 20 and a portion of the extension pattern 32 disposed between the two adjacent connection pad structures 20.

As described above, the solder resist layer 40 may be formed by patterning the photo-imageable solder resist using exposure and developing processes. In this case, a minimum width of the solder resist layer 40 may be determined according to a process ability or resolution during the exposure process. If the minimum width of the solder resist layer 40 that may be implemented during the exposure process is greater than a distance between the two adjacent connection pad structures 20, it may be difficult to form the solder resist layer 40 that covers only the upper portion of the extension pattern 32 positioned between the two adjacent connection pad structures 20. In such a case, the solder resist layer 40 may cover a part of the upper surfaces of the adjacent connection pad structures 20 and reduce an area of exposed upper surfaces of the adjacent connection pad structures 20. Thus, when a solder bump (not shown) is attached onto the exposed upper surfaces of the adjacent connection pad structures 20, a reduced contact area between the solder bump and the connection pad structures 20 or an increase in the contact resistance therebetween may occur due to insufficient wetting of the solder bump.

However, with embodiments of the present application, as shown in FIG. 2A, the plurality of connection pad structures 20 and the extension pattern 32 may be spaced apart from each other by a relatively small distance, and the solder resist layer 40 may not be disposed on the extension pattern 32. The upper surfaces 7 of the plurality of connection pad structures 20 may be positioned at a higher level than the upper surface 5 of the extension pattern 32, and thus the distance between the upper surfaces 7 of the plurality of connection pad structures 20 and the upper surface 5 of the extension pattern 32 may be further increased compared to the case where the upper surfaces of the plurality of connection pad structures 20 are positioned at the same level as the upper surface of the extension pattern 32. That is, a sufficient distance between the plurality of connection pad structures 20 and the extension pattern 32 adjacent to the plurality of connection pad structures may be secured with embodiments of the present application. Thus, even though the solder bump is shifted on the upper surfaces of the plurality of connection pad structures 20 by a predetermined distance in a horizontal direction (or the solder bump is disposed on the upper surfaces of the plurality of connection pad structures 20 outside a center portion thereof) during the mounting of the semiconductor chip on the printed circuit board 10, the solder bump may not be connected to or may not be in contact with the extension pattern 32 because of the sufficient distance between the plurality of connection pad structures 20 and the extension pattern 32. In particular, even though the distance between the plurality of connection pad structures 20 and the extension pattern 32 is small (or the second pitch P2 between the sufficient spaced distance between the plurality of connection pad structures 20 and the extension pattern 32 is small), the potential defects due to an undesired contact between the solder bump and the extension pattern 32 may be prevented or substantially reduced. Thus, it may not be necessary to form the solder resist layer 40 that covers the extension pattern 32 in order to prevent a contact defect between the solder bump and the upper surface of the extension pattern 32.

As shown in FIGS. 2A-2B, the plurality of connection pad structures 20 may have a structure in which a portion of each of the plurality of connection pad structures 20 is partially embedded in the base substrate 12 and another portion thereof protrudes from the upper surface of the base substrate 12. Thus, compared to a case where a connection pad is formed on top of the base substrate 12, the contact area between the base substrate 12 and the plurality of connection pad structures 20 may increase, and thus the plurality of connection pad structures 20 may be firmly attached onto the base substrate 12.

Figure 2C:
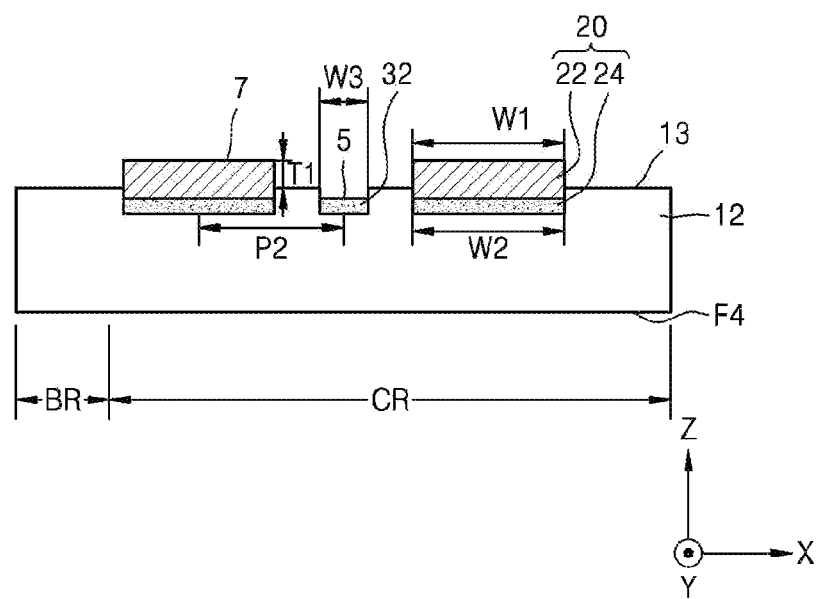
FIG. 2C is a cross-sectional view of a printed circuit board according to some embodiments.

In some other embodiments, as shown in FIG. 2C, a lower portion of a connection pad 22 may be formed extending below an upper surface 13 of a base substrate 12. Also, a top portion of an extension pattern 32 may be recessed. With such embodiments, an overall thickness of a package structure may be reduced while maintaining a distance between an upper surface of a connection pad structure 20 and an upper surface of the extension pattern 32. Also, the connection pad structure 20 may be firmed attached to the base substrate 12.

FIGS. 3 through 9 are cross-sectional views illustrating printed circuit boards 10A, 10B, 10C, 10D, 10E, 10F, and 10G according to example embodiments. The printed circuit boards 10A, 10B, 10C, 10D, 10E, 10F, and 10G shown in FIGS. 3 through 9 may have a similar main part to that of the printed circuit board 10 described with reference to FIGS. 1 and 2A-2B above. Thus, redundant descriptions between FIGS. 3 through 9 and FIGS. 1 and 2 will be omitted. Redundant descriptions between FIGS. 3 through 9 will also be omitted.

Figure 3:
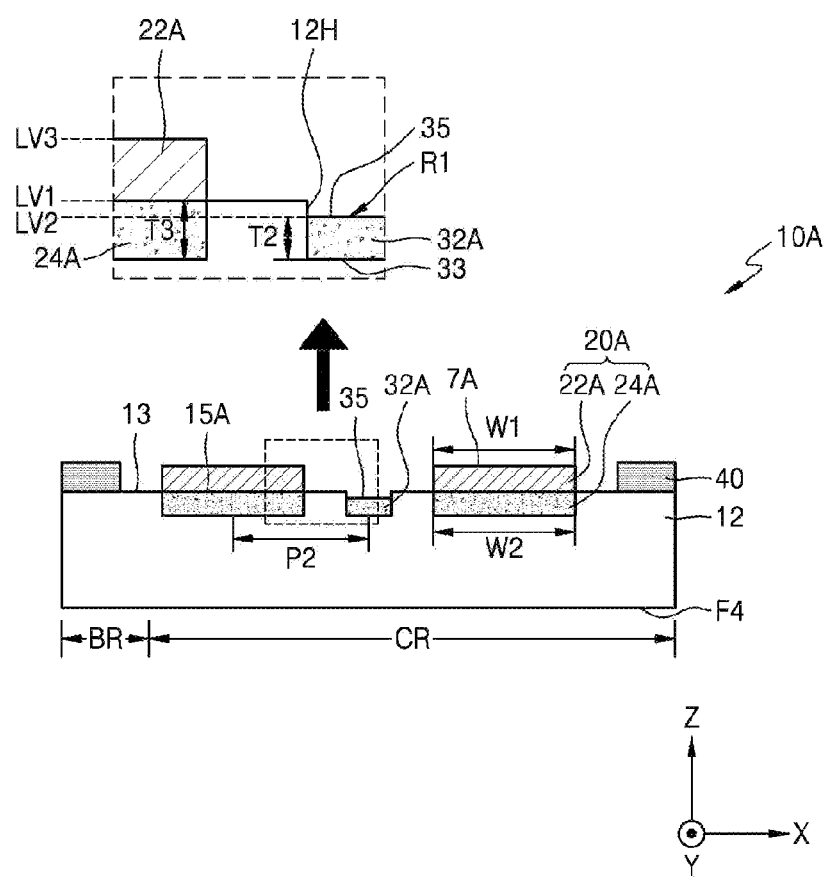
FIG. 3 is a cross-sectional view illustrating a printed circuit board according to example embodiments.

FIG. 3 is a cross-sectional view illustrating the printed circuit board 10A according to example embodiments.

Referring to FIG. 3, an extension pattern 32A may be at least partially embedded in the base substrate 12. In more detail, two side walls extending along an extension direction (for example, a Y direction of FIG. 3) of the extension pattern 32A and a lower surface 33 of the extension pattern 32A may be in contact with the base substrate 12, and an upper surface of the extension pattern 32A may not be in contact with the base substrate 12.

In other words, a trench 12H may be formed in the base substrate 12 to extend along the Y direction and may be partially filled with the extension pattern 32A. Accordingly, an upper surface 35 of the extension pattern 32A may be positioned at a lower level than an upper surface 13 of the base substrate 12. As shown in FIG. 3, the upper surface 35 of the extension pattern 32A may be substantially planar and may extend substantially in parallel to the upper surface 13 of the base substrate 12.

In some embodiments, upper surfaces 15A of a plurality of lower connection patterns 24A may be positioned at substantially the same level as the upper surface 13 of the base substrate 12, and upper surfaces 7A of a plurality of connection pads 22A may be positioned at a higher level than the upper surface 13 of the base substrate 12. FIG. 3 shows that an upper level LV2 of the extension pattern 32A may be lower than an upper level LV1 of the base substrate 12, and upper levels LV3 of the plurality of connection pads 22A are higher than the upper level LV1 of the base substrate 12. However, FIG. 3 shows an exaggerated difference of the upper levels LV1, LV2, and LV3 in order to show an example of relative positions of the upper levels LV1, LV2, and LV3. Thus, the relative positions of the upper levels LV1, LV2, and LV3 may be different from those shown in FIG. 3.

In some embodiments, during a patterning process of forming the plurality of connection pads 22A by patterning a copper foil attached onto the base substrate 12, the copper foil may be removed from an upper portion of the extension pattern 32A and thus the upper surface 35 of the extension pattern 32A may be exposed. In this regard, over-etching may be additionally performed to remove a predetermined thickness of a part of an upper side of the extension pattern 32A, and thus a recessed portion R1 may be formed in the upper portion of the extension pattern 32A such that the upper surface 35 of the extension pattern 32A may be positioned at a lower level than the upper surface 13 of the base substrate 12. A thickness T2 of the extension pattern 32A in a vertical direction may be smaller than a thickness T3 of the plurality of lower connection patterns 24A in the vertical direction.

Since the recessed portion R1 is formed in the upper portion of the extension pattern 32A, a greater distance may be secured between the upper surfaces 7A of the plurality of connection pads 22A and the upper surface 35 of the extension pattern 32A. Thus, even though a solder bump (not shown) is shifted and disposed on the plurality of connection pads 22A during the mounting of a semiconductor chip (not shown), undesired contacts between the plurality of connection pads 22A and the extension pattern 32A adjacent the plurality of connection pads 22A or a short due to the contact may be prevented or substantially reduced.

In particular, even when the solder bump is shifted by a relatively large first moving distance due to tolerance of equipment that may occur during the mounting of the semiconductor chip, the plurality of connection pads 22A and the extension pattern 32A adjacent the plurality of connection pads 22A may not contact each other owing to the large distance between the upper surfaces 7A of the plurality of connection pads 22A and the upper surface 35 of the extension pattern 32A. Thereafter, solder bumps may be self-aligned due to surface tension applied to surfaces of the solder bumps during a reflow process, and the solder bumps mounted after the reflow process may be shifted by a second moving distance smaller than the first moving distance. Thus, although the tolerance of equipment is slightly large during the mounting of the semiconductor chip, alignment positions of the solder bumps may be more precisely adjusted.

If the upper surfaces 7A of the plurality of connection pads 22A and the upper surface 35 of the extension pattern 32A are positioned at the same level (or the distance between the upper surfaces 7A of the plurality of connection pads 22A and the upper surface 35 of the extension pattern 32A is small), the solder bumps may be easily in contact with a part of the extension pattern 32A before the reflow process. In this case, self-alignment may be difficult during the reflow process.

According to the example embodiment of FIG. 3, a large distance can be secured between the upper surfaces 7A of the plurality of connection pads 22A and the upper surface 35 of the extension pattern 32A, and thus a contact between solder bumps and the extension pattern 32A adjacent the solder bumps or an electrical short due to the contact may be prevented or substantially reduced. The alignment positions of the solder bumps may be more precisely adjusted owing to a self-alignment effect.

Figure 4:
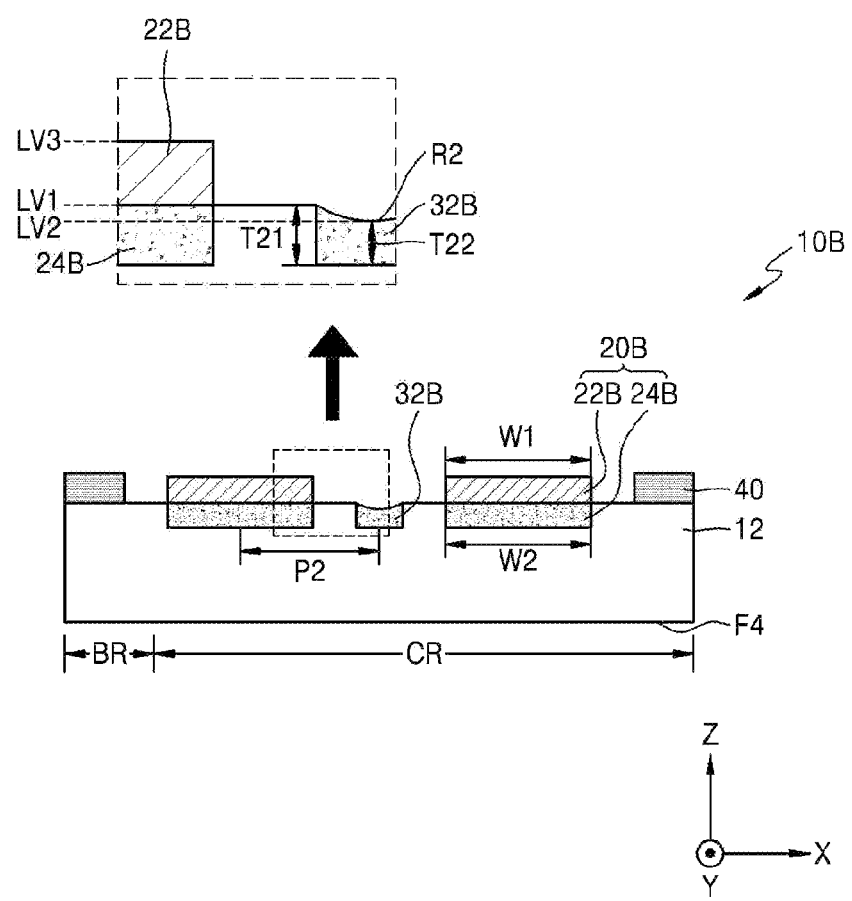
FIG. 4 is a cross-sectional view illustrating a printed circuit board according to example embodiments.

FIG. 4 is a cross-sectional view illustrating the printed circuit board 10B according to some embodiments.

Referring to FIG. 4, an extension pattern 32B may include a rounded recessed portion R2 in an upper portion thereof. The extension pattern 32B may extend in a Y direction, and the recessed portion R2 may also extend in an extension direction (i.e. the Y direction) of the extension pattern 32B. The thickness T22 of a center portion of the extension pattern 32B in a vertical direction, i.e., a Z direction, may be smaller than the thickness T21 of one side wall of the extension pattern 32B in the vertical direction. The upper level LV2 of the center portion of the extension pattern 32B may be lower than the upper level LV1 of the base substrate 12.

In some embodiments, during a patterning process of forming a plurality of connection pads 22B by patterning a copper foil attached onto the base substrate 12, the copper foil may be removed from an upper portion of the extension pattern 32B and thus the upper surface of the extension pattern 32B may be exposed. In this regard, when a part of an upper side of the extension pattern 32B is over-etched, the rounded recessed portion R2 may be formed in an upper portion of the extension pattern 32B.

A plurality of connection pad structures 20B may include a plurality of lower connection patterns 24B having substantially the same upper level as an upper surface 13 of the base substrate 12 and a plurality of connection pads 22B respectively positioned on the plurality of lower connection patterns 24B. The plurality of connection pads 22B may cover entire upper surfaces of the plurality of lower connection patterns 24B. Thus, even though a part of an upper side of the extension pattern 32B is over-etched during a patterning process for forming the plurality of connection pads 22B, upper surfaces of the plurality of lower connection patterns 24B may not be damaged and may be substantially planar. Thus no recessed portion may be formed in the upper surfaces of the lower connection patterns 24B.

Figure 5:
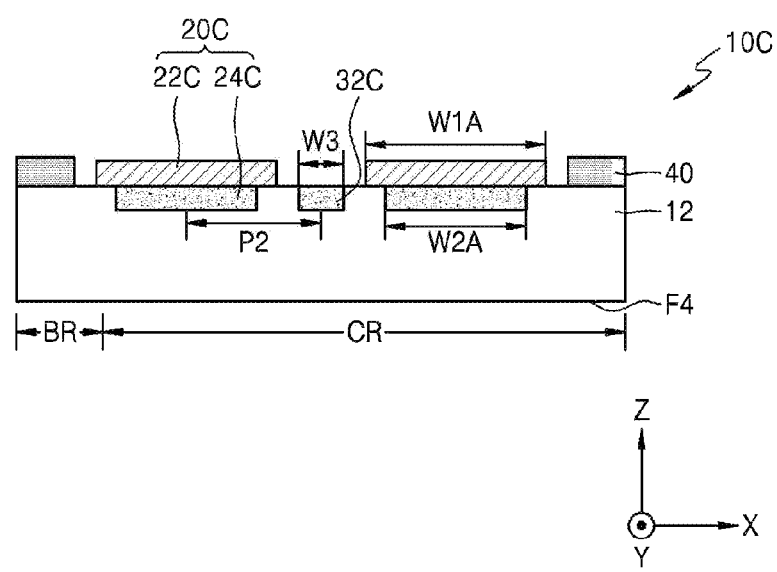
FIG. 5 is a cross-sectional view illustrating a printed circuit board according to example embodiments.

FIG. 5 is a cross-sectional view illustrating the printed circuit board 10C according to some other embodiments.

Referring to FIG. 5, a plurality of connection pad structures 20C may include a plurality of lower connection patterns 24C partially embedded in the base substrate 12 and a plurality of connection pads 22C respectively positioned on the plurality of lower connection patterns 24C and having a first width W1A greater than a second width W2A of the plurality of lower connection patterns 24C.

In some embodiments, the first width W1A of the plurality of connection pads 22C may be in a range from about 10 to about 150 micrometers but is not limited thereto. The second width W2A of the plurality of lower connection patterns 24C may be in a range from about 10 to about 100 micrometers but is not limited thereto.

Since the first width W1A of the plurality of connection pads 22C may be greater than the second width W2A of the plurality of lower connection patterns 24C, the plurality of connection pads 22C may completely cover upper surfaces of the plurality of lower connection patterns 24C. Since the plurality of connection pads 22C may be formed at a relatively great area (or width), when solder bumps are attached onto upper portions of the plurality of connection pads 22C, wettability of the solder bumps may be improved, and a bonding characteristic between the solder bumps and the plurality of connection pads 22C may be improved. Some of the plurality of connection pad structures 20C, i.e., the plurality of lower connection patterns 24C, may be partially embedded in the base substrate 12, and others thereof may be disposed on the base substrate 12, and thus a contact area between the base substrate 12 and the plurality of connection pad structures 20C may increase. Thus, the plurality of connection pad structures 20C may be firmly attached onto the base substrate 12. Therefore, a semiconductor package including the printed circuit board 10C may have an excellent reliability.

Figure 6:
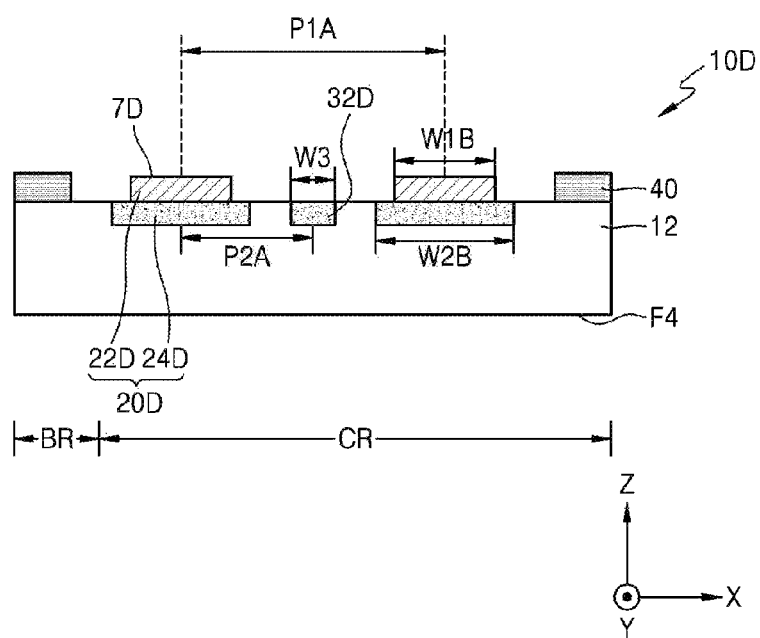
FIG. 6 is a cross-sectional view illustrating a printed circuit board according to example embodiments.

FIG. 6 is a cross-sectional view illustrating the printed circuit board 10D according to example embodiments.

Referring to FIG. 6, a plurality of connection pad structures 20D may include a plurality of lower connection patterns 24D partially embedded in the base substrate 12 and a plurality of connection pads 22D respectively positioned on the plurality of lower connection patterns 24D and having a first width W1B less than a second width W2B of the plurality of lower connection patterns 24D.

In some embodiments, the first width W1B of the plurality of connection pads 22D may be in a range from about 10 to about 100 micrometers but is not limited thereto. The second width W2B of the plurality of lower connection patterns 24D may be in a range from about 10 to about 150 micrometers but is not limited thereto.

Since the first width W1B of the plurality of connection pads 22D may be smaller than the second width W2B of the plurality of lower connection patterns 24D, a portion of upper surfaces of the plurality of lower connection patterns 24D may not be covered by the plurality of connection pads 22D.

The two adjacent connection pad structures 20D may be spaced apart from each other by a first pitch P1A. In this regard, for the sake of convenience, a distance between centers of the two adjacent connection pads 22D is referred to as the first pitch P1A. In this regard, the first pitch P1A may be determined according to a pitch between solder bumps of a semiconductor chip (not shown) disposed on the plurality of connection pad structures 20D. In particular, in a case where the semiconductor chip includes the solder bumps of a fine pitch, since the first pitch P1A of the plurality of connection pads 22D may be smaller, the semiconductor chip of a fine pitch may be mounted on the printed circuit board 10D.

Figure 7:
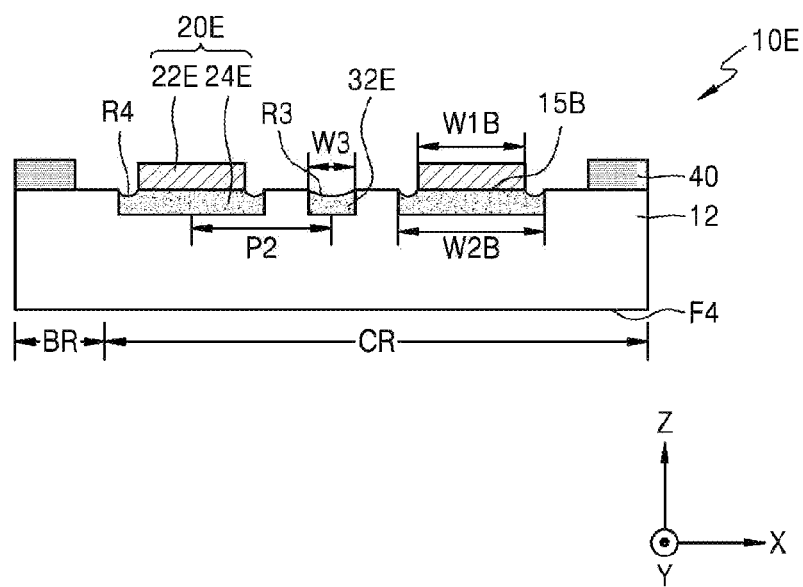
FIG. 7 is a cross-sectional view illustrating a printed circuit board according to example embodiments.

FIG. 7 is a cross-sectional view illustrating the printed circuit board 10E according to example embodiments.

Referring to FIG. 7, a plurality of connection pad structures 20E may include a plurality of lower connection patterns 24E partially embedded in the base substrate 12 and a plurality of connection pads 22E respectively positioned on the plurality of lower connection patterns 24E and having the first width W1B less than the second width W2B of the plurality of lower connection patterns 24E.

The extension pattern 32E may include a rounded recessed portion R3 in an upper portion thereof. In some embodiments, during a patterning process of forming the plurality of connection pads 22E by patterning a copper foil attached onto the base substrate 12, when a portion of an upper side of the extension pattern 32E is over-etched, the rounded recessed portion R3 may be formed in the upper portion of the extension pattern 32E.

Since the first width W1B of the plurality of connection pads 22E may be smaller than the second width W2B of the plurality of lower connection patterns 24E, a portion of upper surfaces 15B of the plurality of lower connection patterns 24E may not be covered by the plurality of connection pads 22E. A rounded recessed portion R4 may be formed in upper portions of the plurality of lower connection patterns 24E that are not covered by the plurality of connection pads 22E. During the patterning process of forming the plurality of connection pads 22E, when a portion of the upper surfaces 15B of the plurality of lower connection patterns 24E that are not covered by the plurality of connection pads 22E is over-etched, the rounded recessed portion R4 may be formed in the upper portions of the plurality of lower connection patterns 24E.

Figure 8:
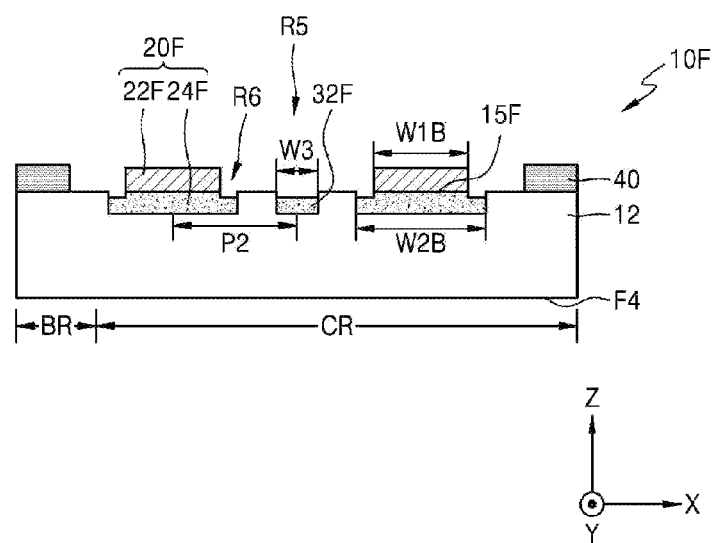
FIG. 8 is a cross-sectional view illustrating a printed circuit board according to example embodiments.

FIG. 8 is a cross-sectional view illustrating the printed circuit board 10F according to some embodiments.

Referring to FIG. 8, a plurality of connection pad structures 20F may include a plurality of lower connection patterns 24F partially embedded in the base substrate 12 and a plurality of connection pads 22F respectively positioned on the plurality of lower connection patterns 24F and having the first width W1B less than the second width W2B of the plurality of lower connection patterns 24F.

The extension pattern 32F may include a rounded recessed portion R5 having a substantially planar lower surface in an upper portion thereof. In some embodiments, during a patterning process of forming the plurality of connection pads 22F by patterning a copper foil attached onto the base substrate 12, when a portion of an upper side of the extension pattern 32F is over-etched, the rounded recessed portion R5 having the substantially planar lower surface may be formed in the upper portion of the extension pattern 32F.

A portion of upper surfaces 15F of the plurality of lower connection patterns 24F may not be covered by the plurality of connection pads 22F. A recessed portion R6 having the substantially planar lower surface may be formed in upper portions of the plurality of lower connection patterns 24F that are not covered by the plurality of connection pads 22F. During the patterning process of forming the plurality of connection pads 22F, when a portion of the upper surfaces 15F of the plurality of lower connection patterns 24F that are not covered by the plurality of connection pads 22F is over-etched, the recessed portion R6 may be formed in the upper portions of the plurality of lower connection patterns 24F.

Figure 9:
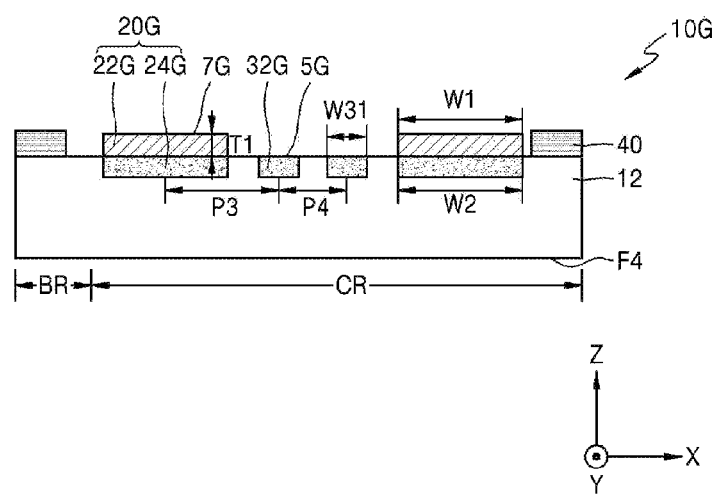
FIG. 9 is a cross-sectional view illustrating a printed circuit board according to example embodiments.

FIG. 9 is a cross-sectional view illustrating the printed circuit board 10G according to some embodiments.

Referring to FIG. 9, at least two extension patterns 32G may be spaced apart from each other and arranged between two adjacent connection pad structures 20G. In example embodiments, a third width W31 of the extension patterns 32G in a horizontal direction, i.e., an X direction, may be in a range from about 2 to about 50 micrometers. For example, the third width W31 may be in a range from about 5 to about 20 micrometers. However, the third width W31 is not limited thereto.

In this regard, for the sake of convenience, the distance between a center of one of the plurality of connection pads 22G and a center of an extension pattern 32G adjacent to the connection pad 22G is referred to as a third pitch P3, and a distance between centers of the two adjacent extension patterns 32G is referred to as a fourth pitch P4. In some embodiments, the third pitch P3 may be in a range from about 10 to about 100 micrometers but is not limited thereto. The fourth pitch P4 may be in a range from about 2 to about 50 micrometers but is not limited thereto.

Even when the at least two extension patterns 32G are spaced apart from each other between the two adjacent connection pad structures 20G, because a sufficient distance can be secured between upper surfaces 7G of the plurality of connection pad structures 20G and upper surfaces 5G of the two extension patterns 32G, even though solder bumps (not shown) are shifted and disposed on the plurality of connection pads 22G during the mounting of a semiconductor chip (not shown), undesired contacts between the plurality of connection pads 22G and the extension patterns 32G adjacent the plurality of connection pads 22G or an electrical short due to the contact may be prevented or substantially reduced.

Figure 10:
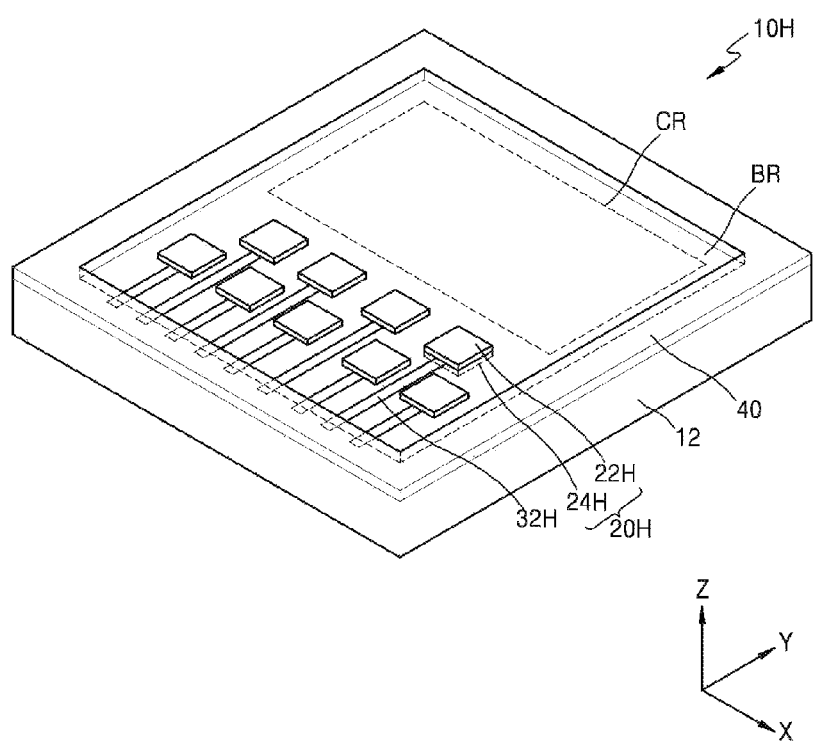
FIG. 10 is a cross-sectional view illustrating a printed circuit board according to example embodiments.

FIG. 10 is a cross-sectional view illustrating the printed circuit board 10H according to some embodiments.

Referring to FIG. 10, a plurality of connection pad structures 20H and an extension pattern 32H may be disposed outside the chip mounting region CR. Although FIG. 10 illustrates that the plurality of connection pad structures 20H are disposed on one side of the chip mounting region CR by way of example, the plurality of connection pad structures 20H may be formed on both sides of the chip mounting region CR so that the plurality of connection pad structures 20H may be disposed in the chip mounting region CR.

The solder resist layer 40 may be disposed on the peripheral region BR of the base substrate 12 and may surround an edge or a periphery of the base substrate 12 on an upper surface of the base substrate 12. A portion of the extension patter 32H may be covered by the solder resist layer 40.

The printed circuit board 10H may be used to electrically connect a semiconductor chip (not shown) and the plurality of connection pad structures 20H via a bonding wire on an upper portion thereof.

FIGS. 11 through 14 are cross-sectional views illustrating a semiconductor package 100 according to some embodiments. A printed circuit board 10I included in the semiconductor package 100 shown in FIGS. 11 through 14 may be replaced with the printed circuit board 10 described with reference to FIGS. 1 and 2 above. The printed circuit board 10I included in the semiconductor package 100 shown in FIGS. 11 through 14 may have a configuration corresponding to each of the printed circuit boards 10A, 10B, 10C, 10D, 10E, 10F, and 10G shown in FIGS. 3 through 9. Thus, redundant descriptions between FIGS. 11 through 14 and FIGS. 1 through 9 will be omitted. Redundant descriptions between FIGS. 11 through 14 will also be omitted.

Figure 11:
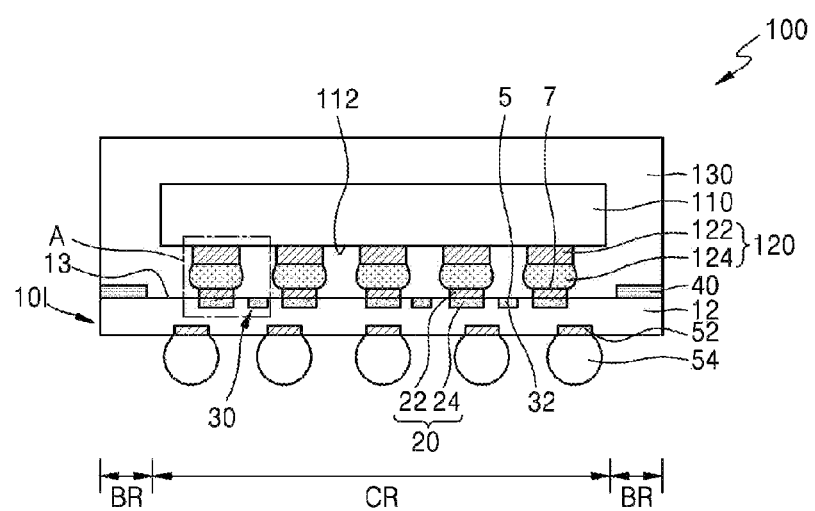
FIG. 11 is a cross-sectional view illustrating a main part of a semiconductor package according to example embodiments.

Referring to FIG. 11, the semiconductor package 100 may include the printed circuit board 10I and a semiconductor chip 110 attached to the printed circuit board 10I.

The printed circuit board 10I may include the base substrate 12 including the chip mounting region CR and the peripheral region BR and the plurality of connection pad structures 20. The plurality of connection pad structures 20 may be disposed in the chip mounting region CR of an upper surface 13 of the base substrate 12. An external connection pad 52 may be disposed on a lower surface of the base substrate 12. An external terminal 54 may be disposed on the external connection pad 52.

The plurality of connection pad structures 20 may include the plurality of lower connection patterns 24 partially embedded in the base substrate 12 and the plurality of connection pads 22 respectively disposed on the plurality of lower connection patterns 24 and having upper surfaces higher than the upper surface of the base substrate 12.

The conductive pattern structure 30 may be formed on the upper surface 13 of the base substrate 12. The conductive pattern structure 30 may include the extension pattern 32 partially embedded in the base substrate 12. The extension pattern 32 may be spaced apart from each of the two adjacent connection pad structures 20 and extend between the two adjacent connection pad structures 20. An upper surface of the extension pattern 32 may be positioned at a lower level than or substantially the same level as the upper surface 13 of the base substrate 12.

The solder resist layer 40 may be formed on the upper surface 13 of the base substrate 12. The solder resist layer 40 may cover a part of the extension pattern 32 and may be spaced apart from the plurality of connection pad structures 20 as shown in FIG. 1. A portion of the upper surface 13 of the base substrate 12 may be exposed by the solder resist layer 40. The solder resist layer 40 may cover a portion of the peripheral region BR and/or a part of the chip mounting region CR.

Although not shown, a lower solder resist layer (not shown) that exposes a portion of the external connection pad 52 may be formed on a lower surface of the base substrate 12.

The semiconductor chip 110 may include a semiconductor device formed on a semiconductor substrate. The semiconductor substrate may include, for example, silicon (Si). Alternatively, the semiconductor substrate may include a semiconductor material such as germanium (Ge) or a compound semiconductor material such as silicon carbide (SiC), gallium arsenide (GaAs), indium arsenide (InAs), or indium phosphide (InP). Alternatively, the semiconductor substrate may have a silicon-on-insulator (SOI) structure. For example, the semiconductor substrate may include a buried oxide (BOX) layer. The semiconductor substrate may include a conductive region, for example, a well region doped with impurities or a conductive structure doped with impurities.

The semiconductor substrate may include various types of a plurality of individual devices. The plurality of individual devices may include, for example, a metal-oxide-semiconductor transistor (MOSFET) such as a complementary metal-oxide-semiconductor (CMOS) transistor, a system large scale integration (LSI) device, an image sensor such as a CMOS image sensor (CIS), a micro-electro-mechanical system (MEMS), an active device, a passive device, etc. The plurality of individual devices may be electrically connected to the conductive region of the semiconductor substrate. The semiconductor device may further include at least two of the plurality of individual devices or conductive lines or conductive plugs that electrically connect the plurality of individual devices and the conductive region of the semiconductor substrate. The plurality of individual devices may be electrically separated from other adjacent individual devices by insulating layers.

The semiconductor device may include conductive line structures for connecting the plurality of individual devices and pads formed on an active surface 112. The conductive line structure may include a metal line layer and a via plug. The metal line layer and the via plug may include a line barrier layer and a line metal layer. The line barrier layer may include at least one of Ti, TiN, Ta, or TaN. The line metal layer may include at least one of W, Al, or Cu. The metal line layer and the via plug may include the same material. Alternatively, at least a portion of the metal line layer and the via plug may include different materials. The metal line layer and/or the via plug may have a multilayer structure including a plurality of metal line layers and a plurality of via plugs. That is, the conductive line structure may be a multilayer structure in which two or more metal line layers or two or more via plugs are alternately stacked. A passivation layer may be formed on the semiconductor device to protect the semiconductor device from the external environment. The pads may be exposed through the passivation layer.

One semiconductor chip 110 is illustrated but a plurality of semiconductor chips may be stacked and interconnected via through electrodes. The through electrodes may have a pillar shape that passes through a semiconductor substrate including the plurality of semiconductor chips except an uppermost semiconductor chip.

The through electrodes may be formed as through silicone vias (TSV). The through electrodes may include the line metal layer and a barrier metal layer surrounding the line metal layer. The line metal layer may include copper (Cu) or tungsten (W). For example, the line metal layer may include copper (Cu), copper tin (CuSn), copper magnesium (CuMg), copper nickel (CuNi), copper zinc (CuZn), copper palladium (CuPd), copper gold (CuAu), copper rhenium (CuRe), copper tungsten (CuW), tungsten (W), a tungsten (W) alloy but is not limited thereto. For example, the line metal layer may include one or more materials among Al, Au, Be, Bi, Co, Cu, Hf, In, Mn, Mo, Ni, Pb, Pd, Pt, Rh, Re, Ru, Ta, Te, Ti, W, Zn, and Zr and may have a stack structure including one or more materials thereof. The barrier metal layer may include at least one of W, WN, WC, Ti, TiN, Ta, TaN, Ru, Co, Mn, Ni, or NiB and may have a single layer or a multilayer. However, materials of the through electrodes may not be limited thereto. The barrier metal layer and the line metal layer may be formed using a physical vapor deposition (PVD) process or a chemical vapor deposition (CVD) process but are not limited thereto. A spacer insulating layer may be disposed between the through electrodes and the semiconductor substrate including the semiconductor chips in which the through electrodes are formed. The spacer insulating layers may prevent the semiconductor device included in the semiconductor substrate in which the through electrodes are formed and the through electrodes from directly contacting each other. The spacer insulating layer may include an oxide layer, a nitride layer, a carbon layer, polymer, or a combination thereof. In example embodiments, the CVD process may be used to form the spacer insulating layers. The spacer insulating layers may include an ozone/tetra-ethyl ortho-silicate ($O_3$/TEOS)-based high aspect ratio process (HARP) formed by a sub-atmospheric CVD process.

Connection bumps may be formed between the plurality of stacked semiconductor chips to electrically connect the through electrodes formed in different semiconductor chips.

The semiconductor chip 110 may be attached to the printed circuit board 10I such that the active surface 112 thereof faces the printed circuit board 10I, i.e. the base substrate 12.

A plurality of chip connection terminals 120 attached to the active surface 112 may be formed in the semiconductor chip 110. The plurality of chip connection terminals 120 may be respectively disposed on the plurality of connection pad structures 20.

Each of the plurality of chip connection terminals 120 may include a conductive pillar 122 and a solder bump 124 formed on the conductive pillar 122 and in contact with the plurality of connection pad structures 20. The conductive pillar 122 may include, for example, a metal material such as copper, nickel, gold, tin, and an alloy thereof. The solder bump 124 may include a metal material that may be reflowed in response to energy from heat, ultrasound and so on.

Figure 12:
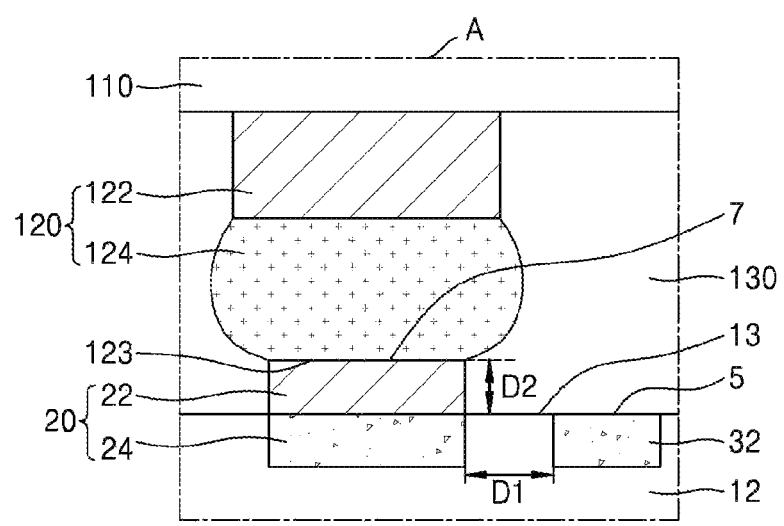
FIGS. 12 through 14 are enlarged cross-sectional views of a portion A of FIG. 11.
Figure 13:
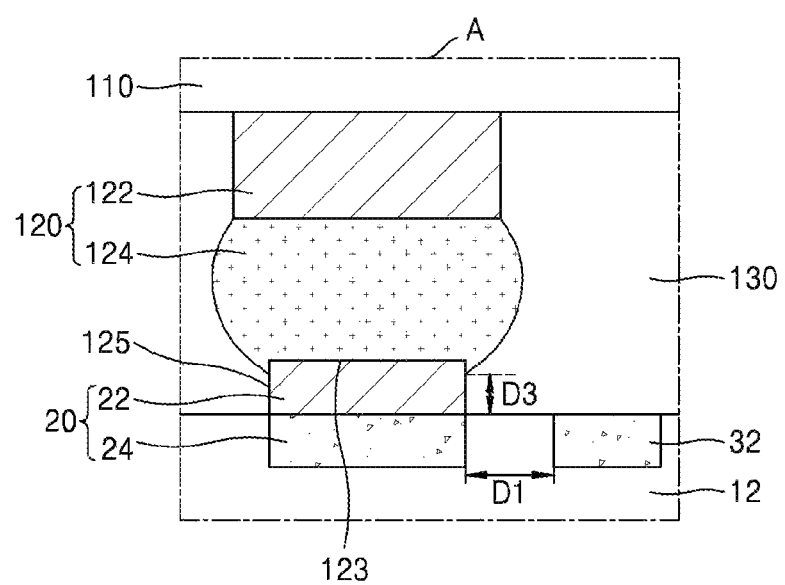
Figure 14:
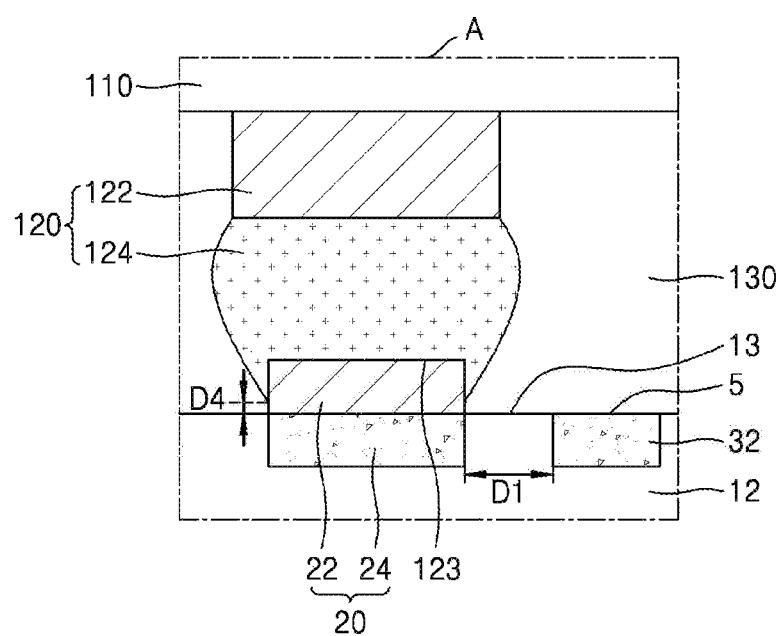

FIGS. 12 through 14 illustrate enlarged cross-sectional views of the plurality of chip connection terminals 120 connected to the plurality of connection pad structures 20. In particular, FIGS. 12 through 14 are enlarged cross-sectional views of a portion A of FIG. 11.

Referring to FIGS. 12 through 14, the solder bump 124 may have side walls that may be rounded and protrude to the outside. As shown in FIG. 12, a lower surface of the solder bump 124 may be in contact with an upper surface of the connection pad 22. The upper surface 7 of the connection pad 22 may be positioned at a higher level than an upper surface 13 of the base substrate 12. Thus, a relatively large distance can be secured between the solder bump 124 and an upper surface 5 of the extension pattern 32 by a second distance D2 between a lowermost surface 123 of the solder bump 124 and the base substrate 12 and a first distance D1 between the lower connection pattern 24 and the extension pattern 32. Thus, even when a solder resist layer for preventing occurrence of a short is not formed on the extension pattern 32, an electrical connection or a contact between the solder bump 124 and the extension pattern 32 may be prevented or substantially reduced.

As shown in FIG. 13, the lower surface 123 of the solder bump 124 may be in contact with an upper portion of a side surface 125 of the connection pad 22. In this case, a third distance D3 between the lowermost surface 123 of the solder bump 124 and the base substrate 12 may be smaller than the second distance D2 between the lowermost surface 123 of the solder bump 124 and the base substrate 12. However, a relatively large distance can still be secured between the solder bump 124 and the upper surface of the extension pattern 32 by the third distance D3 between the lowermost surface of the solder bump 124 and the base substrate 12 and the first spaced distance D1 between the lower connection pattern 24 and the extension pattern 32. Thus, even when the solder resist layer for preventing occurrence of the short is not formed on the extension pattern 32, the electrical connection or the contact between the solder bump 124 and the extension pattern 32 may be prevented or substantially reduced.

As shown in FIG. 14, the lower surface 123 of the solder bump 124 may extend downward such that the lower surface 123 of the solder bump 124 covers almost the entire side walls of the connection pad 22. The lower surface 123 of the solder bump 124 may extend to a point where the base substrate 12 and the connection pad 22 contact each other. On the other hand, the lower surface 123 of the solder bump 124 may not be in contact with the base substrate 12 and may be spaced apart from an upper surface 13 of the base substrate 12 by a fourth distance D4. Since the connection pad 22 and the extension pattern 32 are positioned at different levels in a vertical direction and thus a sufficient distance from the connection pad 22 to the upper surface 5 of the extension pattern 32 may be secured, even when a large volume of solder bumps 124 is disposed on the connection pad 22 before a reflow process, the solder bump 124 is disposed on the connection pad 22 outside a center portion or is shifted by a predetermined distance, the solder bump 124 may extend downward along the side walls of the connection pad 22. In this regard, a contact or a connection between the solder bump 124 and the upper surface 5 of the extension pattern 32 adjacent to the solder bump 124 may be prevented or substantially reduced by a sufficient distance between the solder bump 124 and the upper surface 5 of the extension pattern 32 adjacent to the solder bump 124. Thus, the semiconductor package 100 may provide a stable electrical connection between the semiconductor chip 110 and the printed circuit board 10I.

Referring back to FIG. 11, the semiconductor package 100 may further include a molding member 130 formed on the printed circuit board 10I and encapsulating at least a portion of the semiconductor chip 110. The molding member 130 may include, for example, epoxy molding compound (EMC).

The molding member 130 may substantially entirely cover the chip mounting region CR of the base substrate 12. That is, the molding member 130 may be formed of a molded under-fill (MUF) to substantially entirely cover the upper surface 13 of the base substrate 12 and the conductive pattern structure 30 that are exposed by the solder resist layer 40 and the plurality of chip connection terminals 120.

Figure 15:
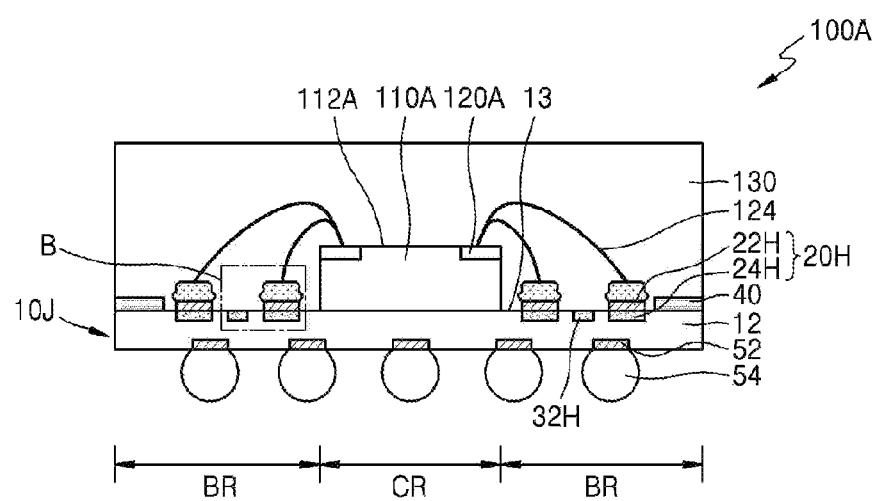
FIG. 15 is a cross-sectional view illustrating a main part of a semiconductor package according to example embodiments.
Figure 16:
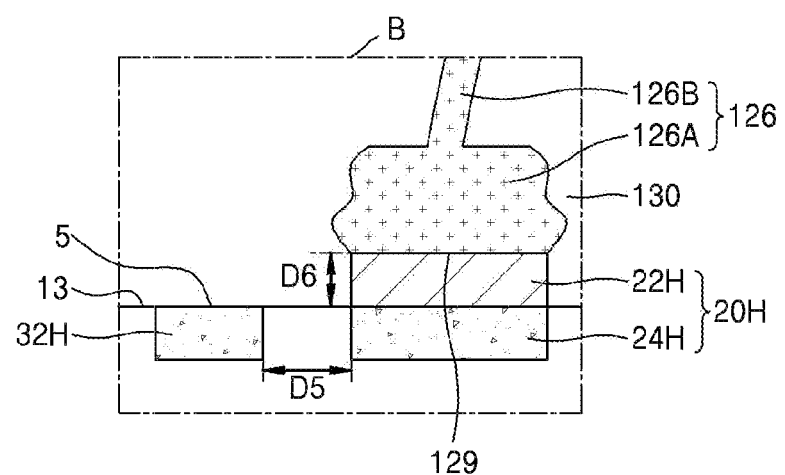
FIG. 16 is an enlarged cross-sectional view of a portion B of FIG. 15.

FIGS. 15 and 16 are cross-sectional views illustrating a semiconductor package 100A according to some embodiments. A printed circuit board 10J included in the semiconductor package 100A shown in FIGS. 15 and 16 may be replaced with the printed circuit board 10H described with reference to FIG. 10 above. Thus, redundant descriptions between FIGS. 15 and 16 and FIGS. 1 through 14 will be omitted.

FIG. 15 is a cross-sectional view illustrating a semiconductor package 100A according to some embodiments. FIG. 16 is an enlarged cross-sectional view of a portion B of FIG. 15.

Referring to FIGS. 15 and 16, the semiconductor package 100A may include the printed circuit board 10J and a semiconductor chip 110A attached to the printed circuit board 10J.

The semiconductor chip 110A may have a similar configuration to that of the semiconductor chip 110 described with reference to FIG. 11. A chip connection terminal 120A or a bonding pad may be disposed on an active surface 112A of the semiconductor chip 110A in which a semiconductor device is formed. The semiconductor chip 110A may be mounted on the chip mounting region CR of the printed circuit board 10J such that a surface opposite the active surface 112A of the semiconductor chip 110A faces the printed circuit board 10J.

A connection member 126 may electrically connect the chip connection terminal 120A and a connection pad structure 20H. The connection member 126 may include a bonding part 126A disposed on an upper surface of the connection pad 22H and a conductive line 126B connected to the bonding part 126A.

The upper surface of the connection pad 22H may be positioned at a higher level than an upper surface 13 of the base substrate 12. A relatively large distance may be secured between the bonding part 126A and an upper surface 5 of an extension pattern 32H by a sixth distance D6 between a lowermost surface 129 of the bonding part 126A and the base substrate 12 and a fifth distance D5 between the lower connection pattern 24H and the extension pattern 32H.

During the attaching of the bonding part 126A to the upper surface of the connection pad 22H, even when the bonding part 126A is shifted on the upper surface of the connection pad 22H by a predetermined distance or is outside of a center portion, a sufficient distance may be secured between the bonding part 126A and the extension pattern 32H adjacent to the bonding part 126A, and thus a contact between the bonding part 126A and the extension pattern 32H adjacent to the bonding part 126A or a short due to the contact may be prevented or substantially reduced.

FIGS. 17 through 22 are cross-sectional views for illustrating a method of manufacturing a printed circuit board according to some embodiments.

FIGS. 17 through 22 are views for describing the method of manufacturing the printed circuit board 10 described with reference to FIGS. 1 and 2 above. FIGS. 17 through 22 are cross-sectional views taken line II'-II' of FIG. 1 according to a process sequence.

Figure 17:
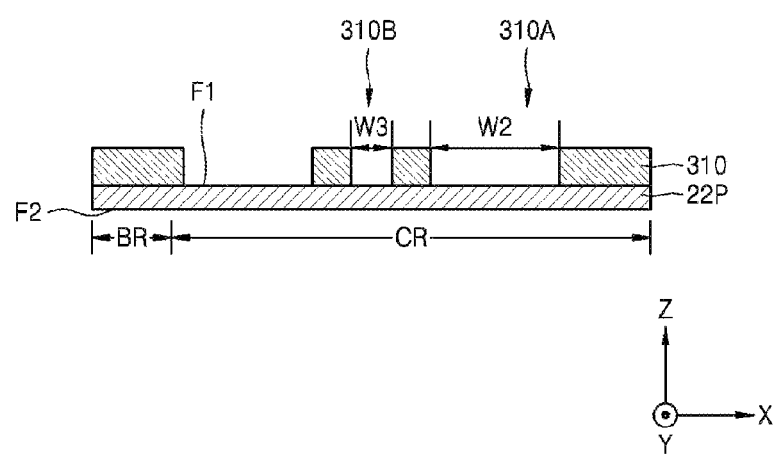
FIGS. 17 through 22 are cross-sectional views for describing a method of manufacturing a printed circuit board according to example embodiments.

Referring to FIG. 17, a conductive film 22P including a first surface (or an upper surface) F1 and a second surface (or a lower surface) F2 that are opposite to each other may be provided. The conductive film 22P may be, for example, a copper foil but is not limited thereto.

A mask layer 310 including a first opening 310A and a second opening 310B may be formed on the first surface F1 of the conductive film 22P to expose portions thereof. The mask layer 310 may be a photoresist mask. The first opening 310A may be an opening for forming a lower connection pattern (see 24 of FIG. 1) during a subsequent process and may have the second width W2. The second opening 310B may be an opening for forming an extension pattern (see 32 of FIG. 1) during the subsequent process and may have the third width W3.

Figure 18:
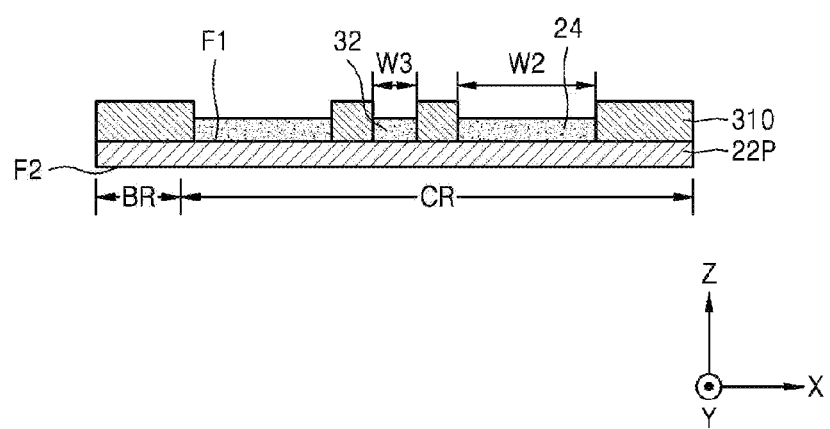

Referring to FIG. 18, the lower connection pattern 24 and the extension pattern 32 that respectively fill the first opening 310A and the second opening 310B may be formed on the first surface F1 of the conductive film 22P.

In some embodiments, the lower connection pattern 24 and the extension pattern 32 may be formed using copper, gold, nickel, or a combination thereof through an electroplating process, an electroless plating process, a sputtering process and so on.

Figure 19:
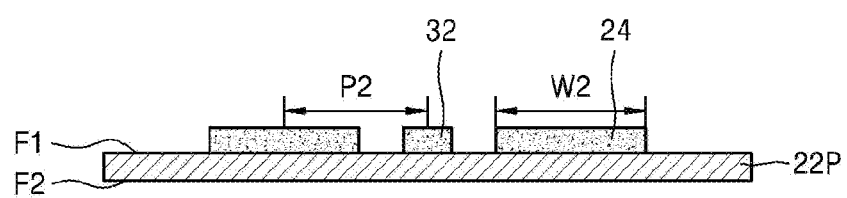

Referring to FIG. 19, the mask layer 310 (see FIG. 18) may be removed from the conductive film 22P.

The lower connection pattern 24 and the extension pattern 32 may be formed on the first surface F1 of the conductive film 22P such that the lower connection pattern 24 and the extension pattern 32 protrude from the first surface F1 of the conductive film 22P by a predetermined height.

Figure 20:
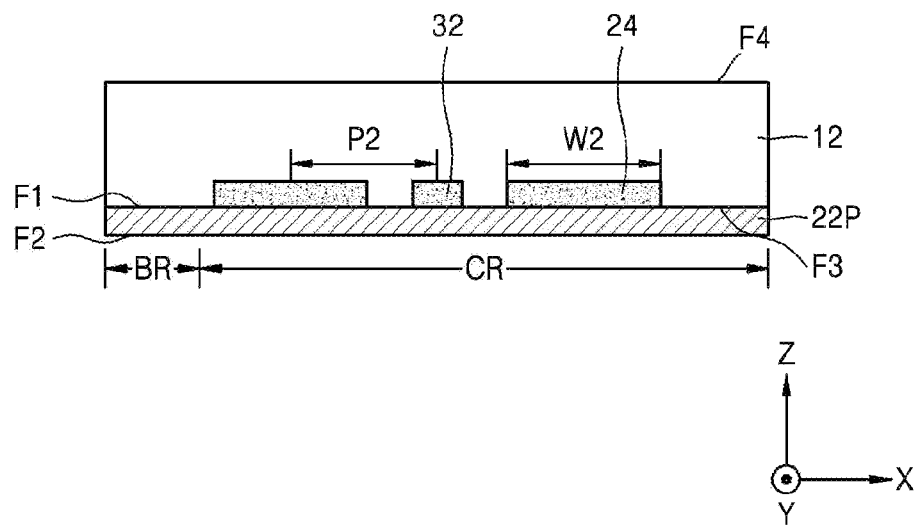

Referring to FIG. 20, a preliminary substrate material layer (not shown) may be formed on the first surface F1 of the conductive film 22P on which the lower connection pattern 24 and the extension pattern 32 are formed and may then be cured, thereby forming the base substrate 12 on the conductive film 22P on which the lower connection pattern 24 and the extension pattern 32 are formed.

In some embodiments, the preliminary substrate material layer may include a B-stage Bimaleimide Triazine (BT) material but is not limited thereto. The preliminary substrate material layer may include a semi-curing material having a low viscosity, and thus the preliminary substrate material layer may be formed on the conductive film 22P on which the lower connection pattern 24 and the extension pattern 32 are formed.

The preliminary substrate material layer may be cured using a heat treatment process, and the heat treatment process may have a temperature in a range from about 30° C. to about 200° C. but is not limited thereto. The preliminary substrate material layer may include examples of materials of the base substrate 12 described with reference to FIG. 1 above.

A surface of the base substrate 12 contacting the conductive film 22P may be referred to as a third surface (or an upper surface) F3, and a surface opposite the third surface F3 may be referred to as a fourth surface (or a lower surface) F4.

Figure 21:
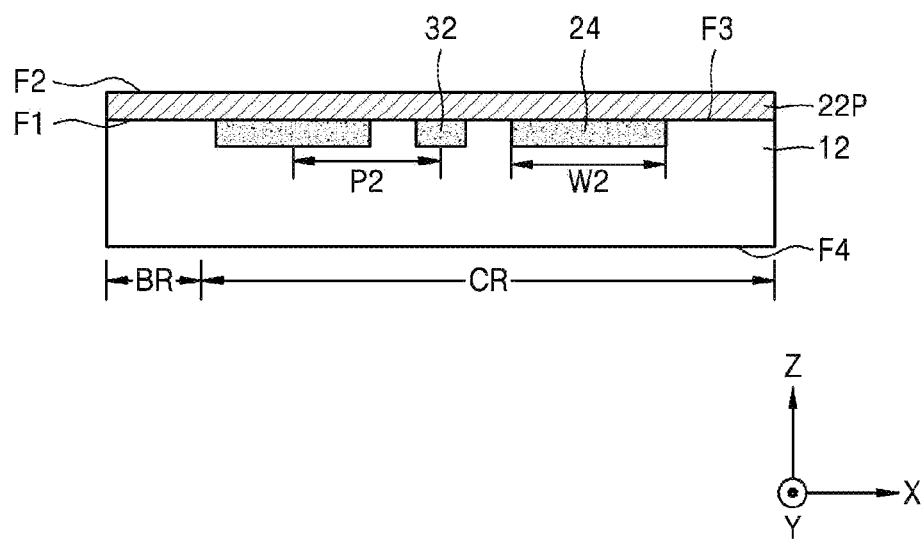

Referring to FIG. 21, a bonding structure of the conductive film 22P and the base substrate 12 may be positioned such that the second surface F2 of the conductive film 22P faces upward.

The preliminary substrate material layer may be in contact with an upper surface of the conductive film 22P without a void, and thus the base substrate 12, the lower connection pattern 24, and the extension pattern 32 may have upper surfaces (i.e., upper surfaces contacting the conductive film 22P) positioned at substantially the same level. That is, the upper surfaces of the lower connection pattern 24 and the extension pattern 32 may be positioned at substantially the same level as the third surface F3 of the base substrate 12.

Figure 22:
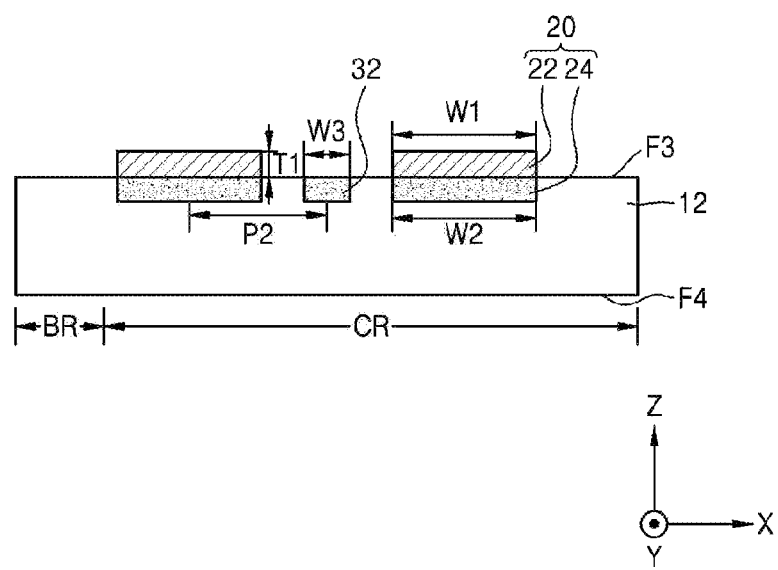

Referring to FIG. 22, the connection pad 22 that covers the lower connection pattern 24 by patterning the conductive film 22P (see FIG. 21) may be formed. As shown in FIG. 22, the connection pad 22 may have the first width W1 that is substantially the same as the second width W2 of the lower connection pattern 24. On the other hand, as shown in FIG. 5, the connection pad 22 may have the first width W1 greater than the second width W2 of the lower connection pattern 24.

In some embodiments, as shown in FIGS. 6 through 8, the connection pad 22 may have the first width W1 smaller than the second width W2 of the lower connection pattern 24. In this regard, when a portion of upper surfaces of the lower connection pattern 24 and the extension pattern 32 is over-etched during the patterning of the conductive film 22P, the rounded recessed portions R3, R4, R5, and R6 may be formed as shown in FIGS. 7 and 8.

Referring to FIG. 2A, the solder resist layer 40 may be formed on the upper surface 13 of the base substrate 12. The solder resist layer 40 may be formed by using a solder mask insulating ink of an epoxy component. The solder resist layer 40 may be formed by directly coating and thermally curing a thermosetting ink, for example, using a silk screen printing method or an ink jet method. The solder resist layer 40 may be formed by coating the base substrate 12 with a coating material, for example, photo-imageable solder resist by using a screen method or a spray coating method, removing an unnecessary portion of the photo-imageable solder resist through exposure and developing, and thermally curing the remaining photo-imageable solder resist. The solder resist layer 40 may be formed using a laminating method of bonding a film solder resist material onto the base substrate 12 to form the printed circuit board 10 described above.

Figure 23:
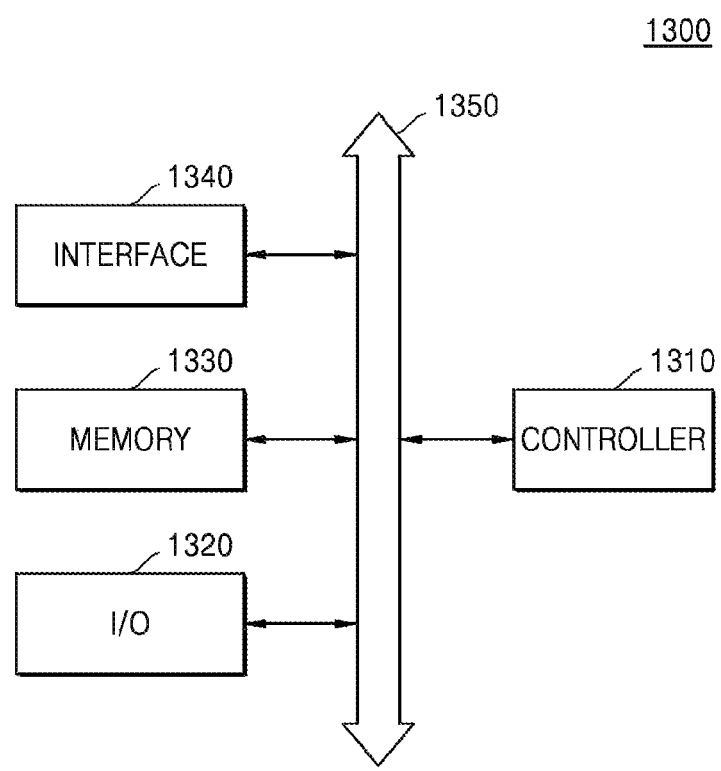
FIG. 23 is a schematic block diagram illustrating an electronic system including a semiconductor package according to some embodiments.

FIG. 23 is a block diagram schematically illustrating an electronic system including a semiconductor package according to some embodiments.

The semiconductor package according to some embodiments may be used in an electronic system. For example, the semiconductor package according to an embodiment may be provided in the form of a memory device. Referring to FIG. 23, an electronic system 1300 may include a controller 1310, an input/output (I/O) device 1320, and a memory device 1330. The controller 1310, the I/O device 1320, and the memory device 1330 may be combined with each other through a data bus 1350. The data bus 1350 may correspond to a path through which electrical signals are transmitted. The controller 1310 may include at least one of a microprocessor, a digital signal processor, a microcontroller, or another similar logic device. The controller 1310 and the memory device 1330 may include one or more of the semiconductor packages according to various embodiments. The I/O device 1320 may include at least one of a keypad, a keyboard and/or a display unit. The memory device 1330 may store data and/or commands executed by the controller 1310. The memory device 1330 may include a volatile memory device and/or a non-volatile memory device. For example, the memory device 1330 may include a FLASH memory device. The flash memory device may be realized as solid state disks (SSD). In this case, the electronic system 1300 may stably store mass data to the flash memory system. The electronic system 1300 may further include an interface unit 1340 configured to transmit electrical data to a communication network or receive electrical data from a communication network. The interface unit 1340 may be configured to operate in a wireless or wired manner. For example, the interface unit 1340 may include an antenna for wireless communication or a transceiver for wired communication. Although not shown in the drawings, the electronic system 1300 may further include an application chipset, a camera image processor (CIS), and an input-output unit.

The electronic system 1300 may be realized as a mobile system, a personal computer, an industrial computer, a logic system, or the like configured to perform various functions. For example, the mobile system may be one of a personal digital assistant (PDA), a portable computer, a web tablet, a wireless phone, a mobile phone, a laptop computer, a digital music system, and an information transmit/receive system. When the electronic system 1300 is configured to perform wireless communication, the electronic system 1300 may be used in a communication interface protocol of a communication system such as CDMA, GSM, NADC, E-TDMA, WCDMA, CDMA2000, Wi-Fi, Muni Wi-Fi, Bluetooth, DECT, Wireless USB, Flash-OFDM, IEEE 802.20, GPRS, iBurst, WiBro, WiMAX, WiMAX-Advanced, UMTS-TDD, HSPA, EVDO, LTE-Advanced, MMDS, and so forth.

Figure 24:
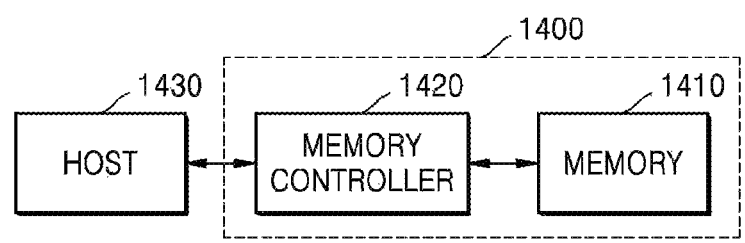
FIG. 24 is a schematic block diagram illustrating an example of memory systems including a semiconductor package according to some embodiments.

FIG. 24 is a block diagram illustrating an example of memory systems including a semiconductor package according to various embodiments.

The semiconductor package may be provided in the form of a memory card. Referring to FIG. 24, a memory system 1400 may include a non-volatile memory device 1410 (e.g., a FLASH memory device) and a memory controller 1420. The non-volatile memory device 1410 and the memory controller 1420 may be configured to store data or read stored data. The non-volatile memory device 1410 may include at least one of the semiconductor packages according to various embodiments. The memory controller 1420 may be configured to control the non-volatile memory device 1410 to read the stored data and/or to store data in response to read/write requests of a host 1430.

While the inventive concept has been particularly shown and described with reference to example embodiments thereof, it will be understood that various changes in form and details may be made therein without departing from the spirit and scope of the following claims.

What is claimed is:

1. A printed circuit board comprising:
    a base substrate comprising a chip mounting region on an upper surface thereof;
    a plurality of connection pad structures in the chip mounting region; and
    an extension pattern in the chip mounting region, spaced apart from each of two adjacent connection pad structures, and extending between the two adjacent connection pad structures,
    wherein upper surfaces of the plurality of connection pad structures are positioned at a higher level than an upper surface of the extension pattern and wherein the upper surface of the extension pattern is recessed below the upper surface of the base substrate and defines a concave shape.

2. The printed circuit board of claim 1, wherein substantially no solder resist layer exists between each of the two adjacent connection pad structures and a portion of the extension pattern extending between the two adjacent connection pad structures.

3. The printed circuit board of claim 1, wherein the extension pattern is at least partially embedded in the base substrate.

4. The printed circuit board of claim 1, wherein the upper surface of the extension pattern is positioned at substantially the same level as an upper surface of the base substrate.

5. The printed circuit board of claim 1, wherein the upper surface of the extension pattern is arranged at a lower level than the upper surface of the base substrate.

6. The printed circuit board of claim 1, wherein a first height of two side walls of the extension pattern extending along an extension direction of the extension pattern is greater than a second height of a portion of the extension pattern between the two side walls.

7. The printed circuit board of claim 1, wherein the plurality of connection pad structures comprise:
    a plurality of lower connection patterns partially embedded in the base substrate; and
    a plurality of connection pads respectively disposed on the plurality of lower connection patterns.

8. The printed circuit board of claim 7, wherein the upper surface of each of the plurality of lower connection patterns is positioned at substantially the same level as an upper surface of the base substrate.

9. The printed circuit board of claim 7, wherein the upper surface of the extension pattern is positioned at a lower level than the upper surface of each of the plurality of lower connection patterns.

10. The printed circuit board of claim 7, wherein the upper surface of each of the plurality of lower connection patterns is substantially entirely covered by each of the plurality of connection pads.

11. The printed circuit board of claim 7, wherein a first width of each of the plurality of lower connection patterns in a horizontal direction is greater than or equal to a second width of each of the plurality of connection pads in the horizontal direction.

12. The printed circuit board of claim 7, wherein a first width of each of the plurality of lower connection patterns in a horizontal direction is less than a second width of each of the plurality of connection pads in the horizontal direction.

13. The printed circuit board of claim 7, wherein a portion of an upper surface of at least one of the plurality of lower connection patterns is not covered by the plurality of connection pads.

14. The printed circuit board of claim 13, wherein the portion of the upper surface of at least one of the plurality of lower connection patterns is positioned at a lower level than the upper surface of the base substrate, wherein the portion of the upper surface of the at least one of the plurality of lower connection patterns defines a concave shape.

15. A printed circuit board comprising:
    a base substrate comprising a chip mounting region on an upper surface thereof;
    first and second connection pad structures spaced apart from each other in the chip mounting region; and
    an extension pattern in the chip mounting region, spaced apart from each of the first and second connection pad structures, and a portion thereof extending between the first and second connection pad structures; and
    wherein the first and second connection pad structures are partially embedded in the base substrate and upper surfaces of the first and second connection pad structures are positioned at a higher level than an upper surface of the base substrate and wherein an upper surface of the extension pattern is recessed below the upper surface of the base substrate and defines a concave shape.

16. The printed circuit board of claim 15, wherein each of the first and second connection pad structures comprises:
    first and second lower connection patterns partially embedded in the base substrate; and
    first and second connection pads respectively disposed on the first and second lower connection patterns.

17. The printed circuit board of claim 15, wherein upper surfaces of the first and second lower connection patterns are positioned at substantially the same level as the upper surface of the base substrate.

18. The printed circuit board of claim 15, wherein an upper surface of the extension pattern is positioned at a lower level than or substantially the same level as the upper surfaces of the first and second lower connection patterns.

19. A printed circuit board comprising:
    a base substrate having an upper surface;
    a plurality of connection pad structures partially embedded in the upper surface of the base substrate; and
    an extension pattern embedded in the upper surface of the base substrate, spaced apart from each of two adjacent connection pad structures, and extending between the two adjacent connection pad structures,
    wherein the plurality of connection pad structures have a structure in which a portion of each of the plurality of connection pad structures is partially embedded in the base substrate and another portion thereof protrudes from the upper surface of the base substrate and wherein an upper surface of the extension pattern is recessed below the upper surface of the base substrate and defines a concave shape.

20. The printed circuit board of claim 19, wherein upper surfaces of the plurality of connection pad structures are positioned at a higher level than an upper surface of the extension pattern.

* * * * *